(12) United States Patent
Lowrey et al.

(10) Patent No.: US 7,308,067 B2
(45) Date of Patent: Dec. 11, 2007

(54) READ BIAS SCHEME FOR PHASE CHANGE MEMORIES

(75) Inventors: Tyler A. Lowrey, West Augusta, VA (US); Ward D. Parkinson, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 477 days.

(21) Appl. No.: 10/633,872

(22) Filed: Aug. 4, 2003

(65) Prior Publication Data

US 2005/0030787 A1 Feb. 10, 2005

(51) Int. Cl.
*G11C 16/04* (2006.01)

(52) U.S. Cl. .................. 376/185.24; 365/163
(58) Field of Classification Search ............... 365/163, 365/175, 184, 185.24
See application file for complete search history.

(56) References Cited

U.S. PATENT DOCUMENTS

| | | | |
|---|---|---|---|
| 4,199,692 A | | 4/1980 | Neale |
| 4,228,524 A | * | 10/1980 | Neale et al. ............. 365/163 |
| 4,599,705 A | * | 7/1986 | Holmberg et al. ......... 365/163 |
| 5,536,947 A | | 7/1996 | Klersy et al. |
| 6,084,649 A | * | 7/2000 | Amano et al. ............. 349/96 |
| 6,141,241 A | * | 10/2000 | Ovshinsky et al. ........ 365/163 |
| 6,426,891 B1 | * | 7/2002 | Katori ..................... 365/175 |
| 6,791,867 B2 | * | 9/2004 | Tran ....................... 365/158 |
| 6,795,338 B2 | * | 9/2004 | Parkinson et al. ......... 365/163 |
| 6,831,856 B2 | * | 12/2004 | Pashmakov ............... 365/163 |
| 6,867,425 B2 | * | 3/2005 | Wicker .................... 257/3 |
| 6,914,801 B2 | * | 7/2005 | Kostylev et al. ........... 365/148 |
| 2004/0113137 A1 | * | 6/2004 | Lowrey .................... 257/5 |

FOREIGN PATENT DOCUMENTS

| | | |
|---|---|---|
| EP | 1 489 623 | 12/2004 |
| WO | WO 00/57498 | 9/2000 |
| WO | WO 2004/055828 | 7/2004 |
| WO | WO 2004/055899 | 7/2004 |
| WO | WO 2005/017904 | 2/2005 |

OTHER PUBLICATIONS

Yi-Chou Chen et al., *An Access-Transistor-Free (0T/1R) Non-Volatile Resistance Random Access Memory (RRAM) Using A Novel Threshold Switching, Self-Rectifying Chalcogenide Device*, Intl. Electron Devices Mtg. 2003, IEDM, Technical Digest, Washington, DC Dec. 8-10, 2003, New York, NY: IEEE, pp. 905-908.

Agostino Pirovano et al., *Low-Field Amorphous State Resistance And Threshold Voltage Drift In Chalcogenide Materials*, IEEE Transactions On Electron Devices, IEEE Inc., New York, NY, vol. 51, No. 5, May 2004, pp. 714-719.

F. Pellizzer et al., *Novel µ Trench Phase-Change Memory Cell For Embedded And Stand-Alone Non-Volatile Memory Applications*, VLSI Technology, 2004, Digest of Technical Papers 2004 Symposium, Honolulu, HI, Jun. 15-17, 2004, Piscataway, NJ, IEEE, Jun. 15, 2004, pp. 18-19.

* cited by examiner

*Primary Examiner*—Thong Q. Le
(74) *Attorney, Agent, or Firm*—Trop, Pruner & Hu, P.C.

(57) ABSTRACT

A read bias scheme may be used for phase change memories including a chalcogenide access device and a chalcogenide memory element. Through an appropriate read bias scheme, desirable read margin can be achieved. This may result in better yield, higher reliability, and ultimately lower costs in some cases.

13 Claims, 6 Drawing Sheets

READ BIAS SCHEME FOR PHASE CHANGE MEMORIES

BACKGROUND

This invention relates generally to memories utilized to store electronic information.

When reading device data from phase change memory cells, a voltage is applied that may be lower than the threshold voltage, in one situation, and the current is measured in order to enable the determination of the device resistance. The measured device resistance determines the degree of crystallinity present in the phase change memory and, thus, the state of the data stored in the cell.

When reading a reset or higher resistance bit, if the read voltage is greater than the threshold voltage, the device may snap back to a much lower voltage and a much higher value of current may be measured due to the fact that the device is turned on. In such case it may be difficult to distinguish between the set or lower resistance and the reset states of the bit. A read scheme that forces voltage to read data has to ensure with margin that a voltage less than the threshold voltage is applied. Similarly, the same effect can be seen in systems that read device data by forcing a current.

Thus, there is a need for a way to read phase change memories that provides a higher margin.

DETAILED DESCRIPTION

Figure 1:
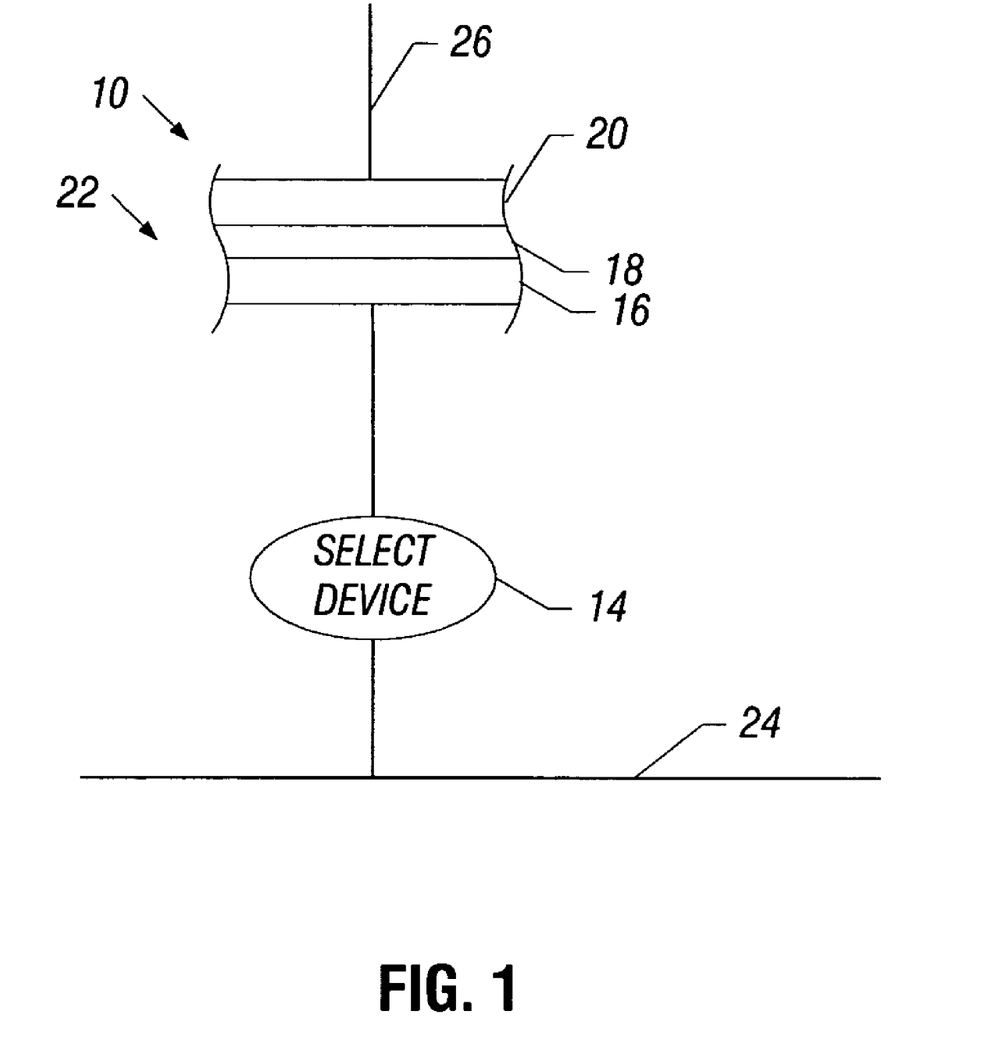
FIG. 1 is a depiction of a memory array in accordance with one embodiment of the present invention.

Referring to FIG. 1, a phase change memory cell 10 may be included within a memory array arranged in columns 26 and rows 24. Each cell 10 may include a memory element 22 and a select device 14. The select device 14 may be a diode, a transistor, or an ovonic device, to mention a few examples. While the terms "rows" and "columns" are used herein, these terms are in a sense arbitrary and these terms refer to any conductive line used to address the cell 10.

The memory element 22 may include an upper electrode 20, a phase change material layer 18, and a lower electrode 16. The element 22, the select device 14, and the lines 24 and 26 may be formed in or on a semiconductor substrate.

In one embodiment, the phase change material 18 may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material may be chalcogenide element composition from the class of tellurium-germanium-antimony ($Te_xGe_ySb_z$) material or a GeSbTe alloy, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material to alter the state or phase of the material may be accomplished by applying voltage potentials to the electrodes 16 and 20, thereby generating a voltage potential across the memory material layer 18. An electrical current may flow through a portion of the memory material layer 18 in response to the applied voltage potentials, and may result in heating of the memory material layer 18.

This heating and subsequent cooling may alter the memory state or phase of the memory material layer 18. Altering the phase or state of the memory material layer 18 may alter an electrical characteristic of the memory material layer 18. For example, resistance of the material layer 18 may be altered by altering the phase of the memory material layer 18. The memory material may also be referred to as a programmable resistive material or simply a programmable material.

In one embodiment, a voltage potential difference of about 0.5-1.5 volts may be applied across a portion of the memory material by applying about 0 volts to a lower electrode 16 and about 0.5-1.5 volts to an upper electrode 20. A current flowing through the memory material layer 18 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphize the memory material and "reset" memory material (e.g., program memory material to a logic "0" value). Heating the volume or memory material to a relatively lower crystallization temperature may crystallize memory material and "set" the memory material (e.g., program memory material to a logic "1" value). Various resistances of memory material may be achieved to store information by varying the amount of current flow and duration through the volume of memory material.

The information stored in memory material 24 may be read by measuring the resistance of the memory material. As an example, a read current may be provided to the memory material layer 18 using opposed electrodes 16, 20 and a resulting read voltage across the memory material layer 18 may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Conventionally, phase change memory devices are read in the region below the threshold voltage $V_T$. If a voltage in excess of the threshold voltage is experienced, the element 22 experiences what is called a snapback, wherein there is a dramatic change in voltage and current after the threshold voltage has been exceeded.

The phase change element 22 may be programmed to a zero state such that in a low voltage or low field regime, it exhibits a very high resistance. The off resistance can, for example, range from 50,000 ohms to greater than 10 megaohms at a low bias. The element 22 may remain in its off state until a threshold voltage $V_T$ or threshold current $I_T$ switches the element 22 to a highly conductive, low resistance on state. The voltage across the element 22 after turn on drops to a slightly lower voltage, called the holding voltage $V_H$ and remains very close to the threshold voltage.

After passing through the snapback region, in the on state, the element 22 voltage drop remains close to the holding voltage as the current passing through the device is increased up to a certain, relatively high, current level. Above that current level the device remains on but displays a finite differential resistance with the voltage drop increasing with increasing current. The element 22 may remain on until the current through the element 22 is dropped below a characteristic holding current value or the voltage is dropped below a characteristic holding voltage value, both of which may be dependent on the size and the material utilized to form the device 22. The snapback voltage is effectively the threshold voltage minus the holding voltage.

Figure 2:
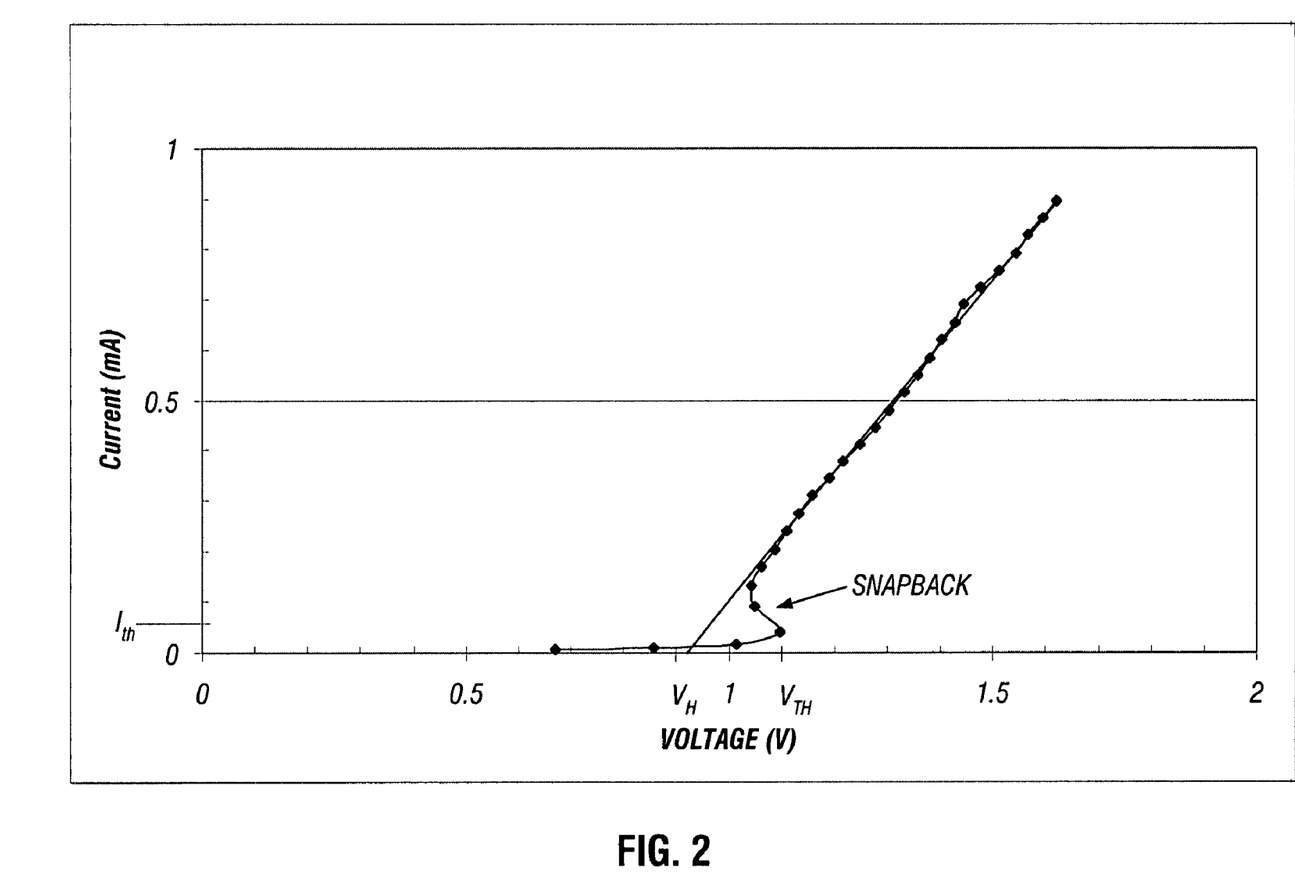
FIG. 2 is a hypothetical or illustrative plot of current versus voltage for an access device in accordance with one embodiment of the present invention.

In a hypothetical current versus voltage plot of FIG. 2, the amount of snapback has been significantly reduced. This may be accomplished in a number of ways. In one embodiment, the element 22 structure may be designed to provide for a higher holding voltage, for example without limiting the present invention in this respect, around 0.92 volts. The holding voltage may be targeted to be more comparable to the threshold voltage. In one embodiment, the holding voltage is at least 80% or higher of the threshold voltage.

As a result, greatly reduced snapback may be achieved in some embodiments, although the scope of the present invention is not limited in this respect. The snapback may be reduced to such an extent that a forced current read scheme can be used with a current higher than the threshold current, in some embodiments. In fact, it may be desirable to provide a read voltage greater than the threshold voltage for the reset case.

As a result, a much higher margin can be achieved in reading, compared to the conventional approach in which the read voltage or current must remain below the threshold voltage or current. In some embodiments of the present invention, the read current may only be limited by the value that disturbs a read bit with continuous read cycles. That value may be approximately 10 percent of the reset current while programming currents may vary by as much as two times.

In one embodiment, a higher value for the holding voltage may be achieved by selecting suitable resistive electrode materials for the upper electrode 20 and/or lower electrode 16, although the scope of the present invention is not limited in this respect. For example, titanium silicon nitride or carbon may be used to form the electrode 20 or 16 and to provide a holding voltage that is approximately 0.9 volts to 1.5 volts in one embodiment of the present invention. The threshold voltage of the memory element 22 may also be tailored to be comparable to its holding voltage by optimizing the thickness of the phase change material 18. Providing the element 22 with a threshold voltage approximately equal to the holding voltage reduces the snapback effect.

Figure 3:
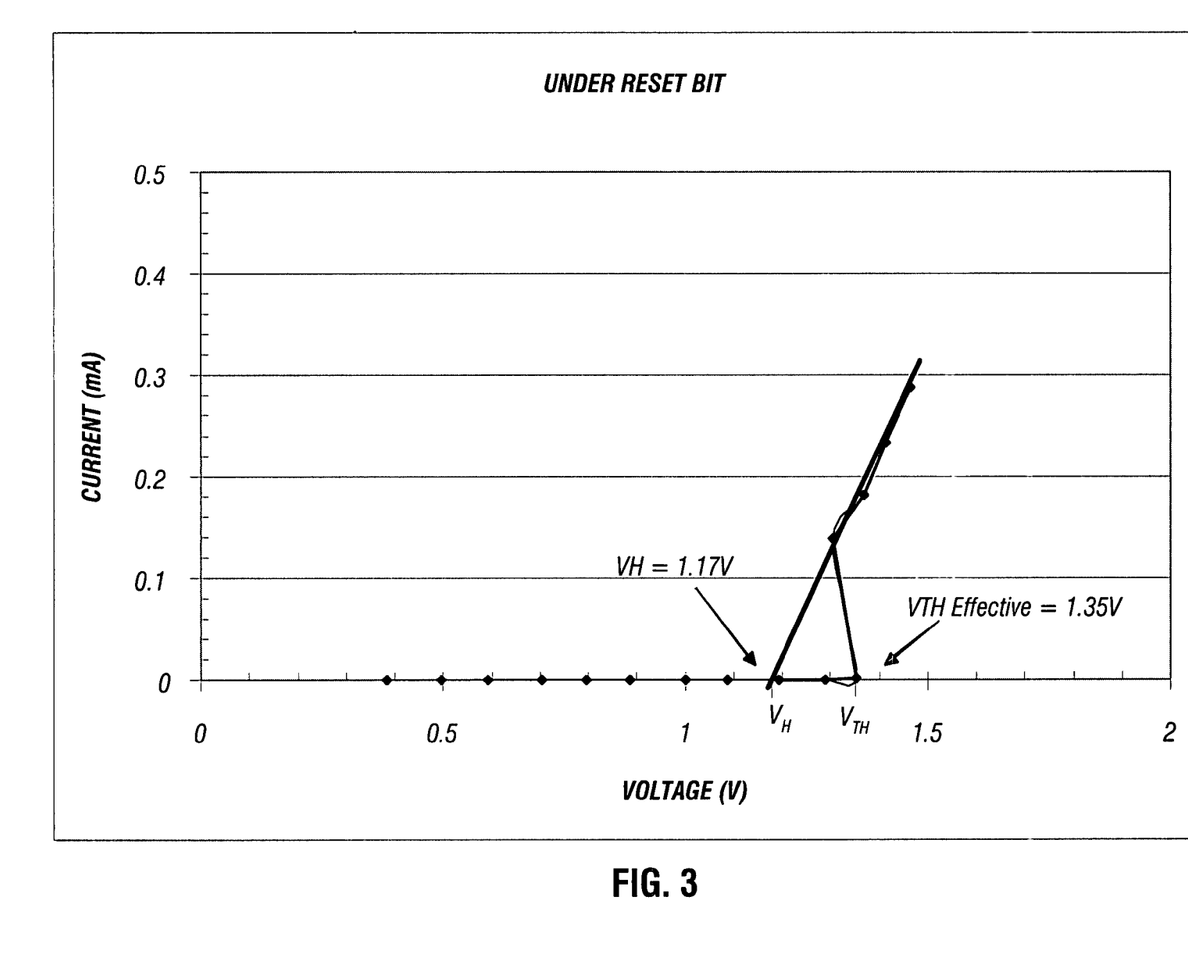
FIG. 3 is a depiction of a biasing scheme in accordance with one embodiment of the present invention.
Figure 4:
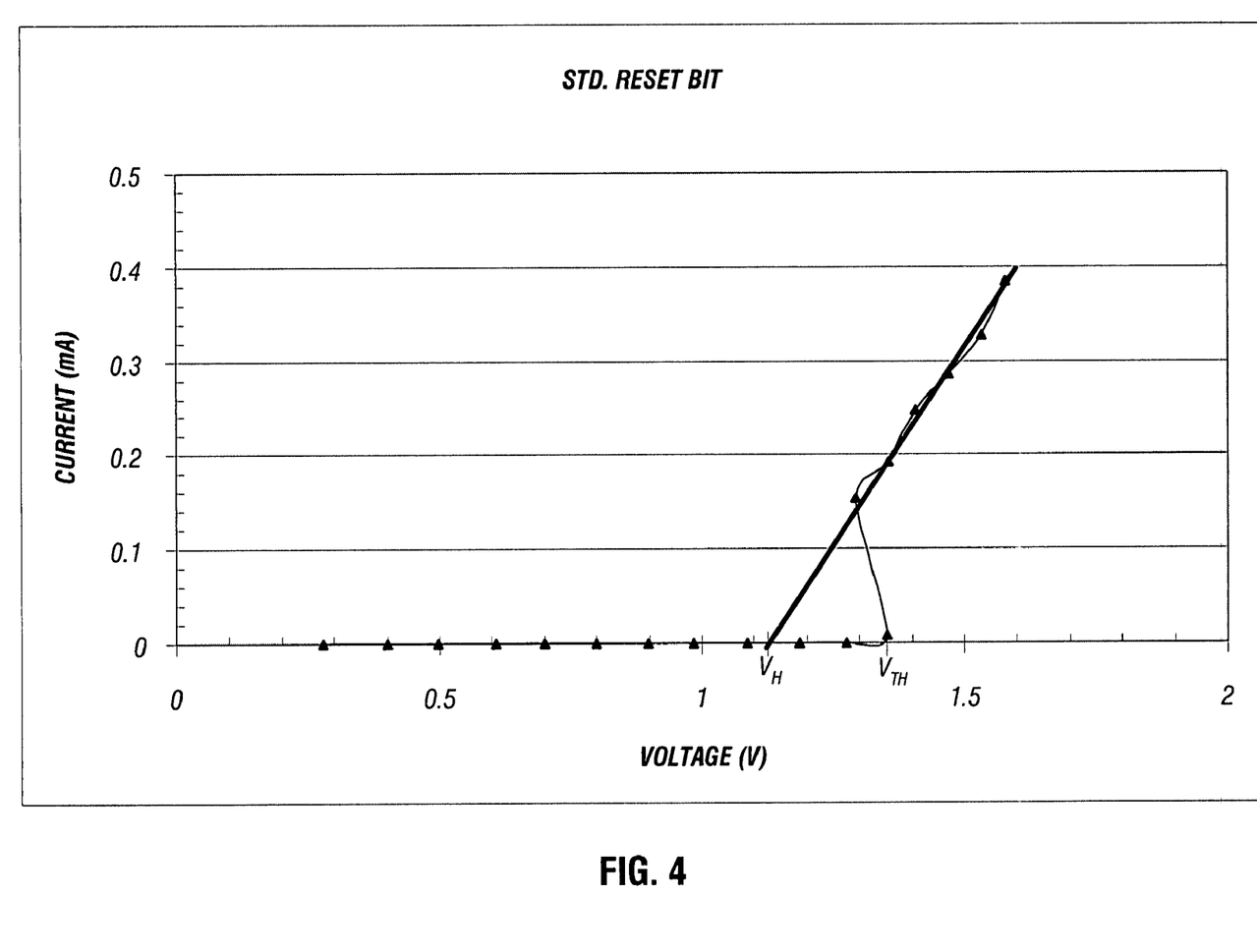
FIG. 4 is a depiction of another biasing scheme in accordance with one embodiment of the present invention.
Figure 5:
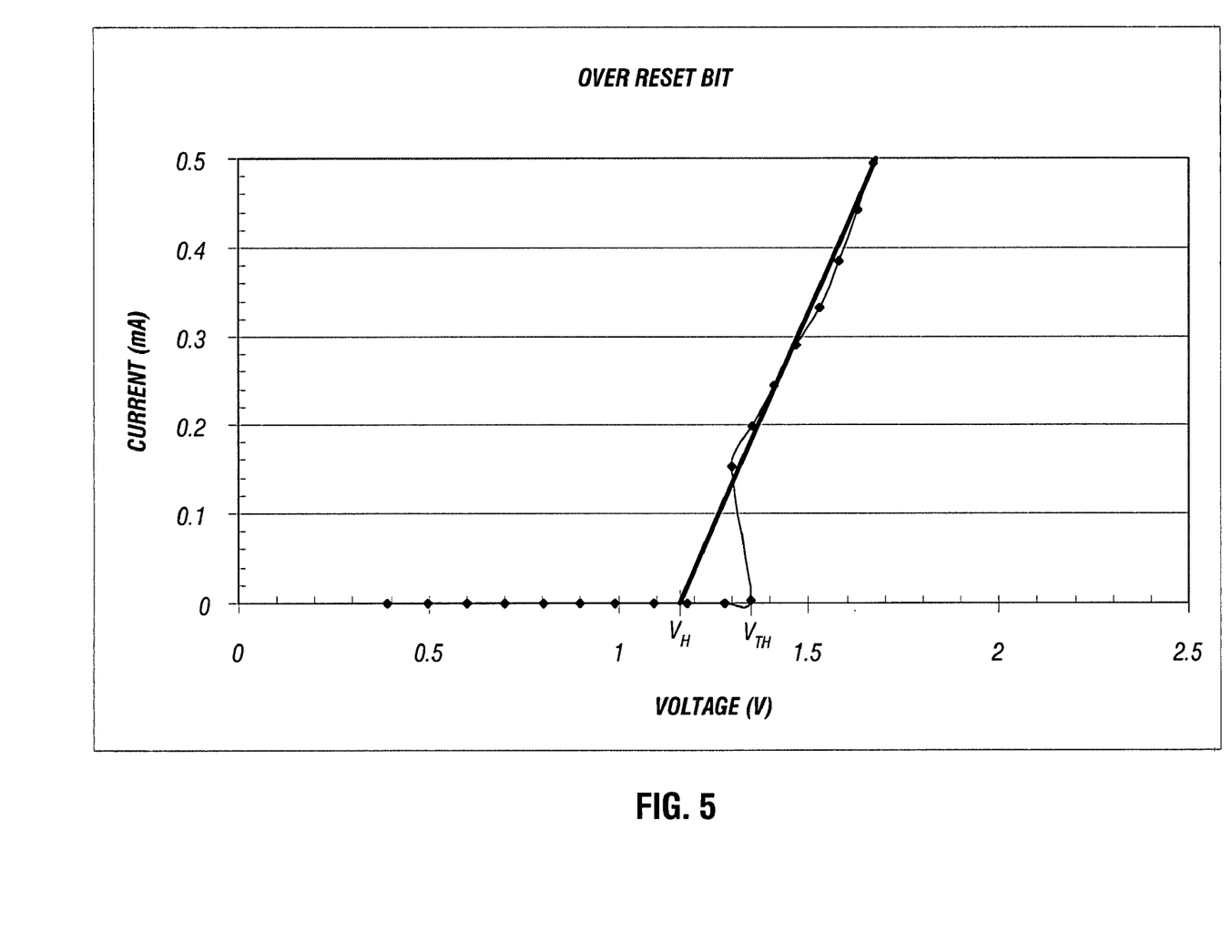
FIG. 5 is an enlarged, cross-sectional view at an early stage of manufacture of the memory array shown in FIG. 1.

Referring to FIGS. 3-5, a more consistent, effective threshold voltage may be achieved in some embodiments. With conventional phase change memory elements, the threshold voltage varies significantly with the amount of reset current supplied to the element during programming a reset bit. In some embodiments of the present invention, where the device's nominal threshold voltage is near its holding voltage, the threshold voltage does not vary significantly with the amount of reset programming current, although the scope of the present invention is not limited in this respect. In FIG. 3, a bit is programmed in the reset state with a relatively low reset programming current. In FIG. 4, the reset bit is programmed with a standard reset programming current. In FIG. 5, the reset bit was programmed with a relatively high reset programming current. As a result, the holding voltage is 1.17, 1.13, and 1.17, respectively, but the threshold voltage is approximately 1.35, 1.36, and 1.36, respectively. The threshold voltage does not vary significantly with reset programming current, in some embodiments of the present invention. In one embodiment, the threshold voltage does not vary by more than 10% under different programming currents.

If the threshold voltage is relatively constant or substantially non-changing, the read current or voltage may be easily targeted above the threshold current or voltage or even approximately at the threshold current or voltage. By making the holding voltage close to the threshold voltage, the holding voltage determines when the element turns on, which may result in a more stable threshold voltage over varying reset programming conditions.

Reading a phase change memory element 22 can be performed as follows. Zero volts is applied to the selected row. A current is forced at a value greater than or equal to the threshold current of the element 22. If the phase change memory element 22 is set, the memory device 22 presents a low voltage, high current condition to a sense amplifier. If the element 22 is reset, a larger voltage, lower current condition may be presented to the sense amplifier. The sense amplifier can either compare the resulting column voltage to a reference voltage or compare the resulting column current to a reference current.

Figure 6:
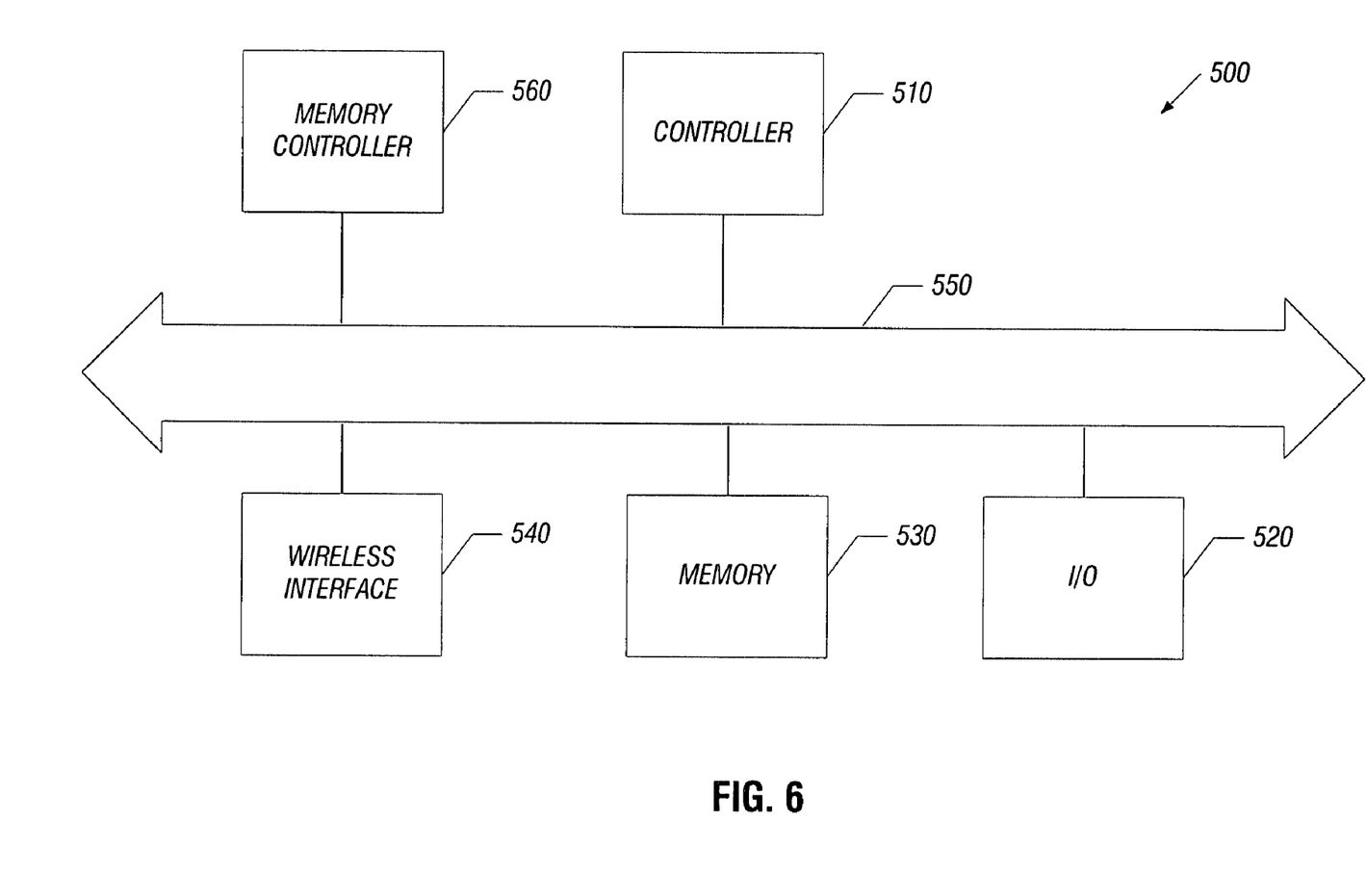
FIG. 6 is a system depiction in accordance with one embodiment of the present invention.

Turning to FIG. 6, a portion of the system 500 in accordance with an embodiment of the present invention is described. The system 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited in this respect and may be used with wired systems as well.

The system 500 may include a controller 510, an input/output (I/O) device 520 (e.g., a keypad display), a memory 530, a memory controller 560, and a wireless interface 540 coupled to each other via a bus 550. It should be noted that the scope of the present invention is not limited to embodiments having any or all of these components.

The controller 510 may comprises, for example, one or more microprocessors, digital signal processors, microcontrollers, or the like. The memory 530 may be used to store messages transmitted to or by the system. The memory 530 may also be optionally used to store instructions that are executed by the controller 510. During the operation of the system 500 it may be used to store user data. The memory 530 may be provided by one or more different types of memory. For example, a memory 530 may comprise a volatile memory (any type of random access memory), a non-volatile memory such as a flash memory, and/or phase change memory that includes a memory such as, for example, memory element 22.

The I/O device 520 may be utilized to generate a message. The system 500 may use the wireless interface 540 to transmit and receive messages to and from a wireless communication network with a wireless radio frequency (RF) signal. Examples of the wireless interface 540 may include an antenna or a wireless transceiver, such as a dipole antenna, although the scope of the present invention is not limited in this respect.

The memory controller 560 and the memory 530 may be separate integrated circuits in one embodiment. The memory controller 560 may cause the memory 530 to be read. The memory controller 560 can issue a command to read the memory 530. Addressing circuits in the memory generate the voltages/currents on the lines 24. Those voltages/currents may be applied to a selected cell whose lines 24 have the appropriate signals applied to them.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
forming a phase change memory element having a holding voltage tat is at least 80 percent of the threshold voltage of the element and a holding voltage greater than about 0.9 volts.

2. The method of claim 1 including forming a phase change memory element to have a threshold voltage that does not vary by more than 10 percent with programming currents varying as much as two times.

3. The method of claim 1 including forming a phase change memory element including a phase change material between a pair of electrodes.

4. The method of claim 3 including forming a phase change material with a lower electrode of titanium silicon nitride.

5. An apparatus comprising:
a phase change memory element to be read with a voltage greater than or equal to the threshold voltage of the element, said element having a holding voltage that is at least 80 percent of the threshold voltage of the element.

6. The apparatus of claim 5 wherein said element includes an upper and a lower electrode and a phase change material between said electrodes.

7. The apparatus of claim 5 wherein the phase change memory element has a threshold voltage that varies by less than 10 percent with varying programming currents.

8. The apparatus of claim 6 wherein said lower electrode includes titanium silicon nitride or carbon.

9. A system comprising:
a processor; and
a phase change memory element having a holding voltage that is at least 80 percent of the threshold voltage of the element and said holding voltage being at least about 0.9 volts.

10. The system of claim 9 wherein said wireless interface includes a dipole antenna.

11. The system of claim 9 wherein said element includes an upper and lower electrode and a phase change material between said electrodes.

12. The system of claim 11 wherein said lower electrode includes titanium silicon nitride.

13. The system of claim 9 wherein the phase change memory element has a threshold voltage that does not vary by more than 10 percent with programming currents varying by as much as two times.

* * * * *

UNITED STATES PATENT AND TRADEMARK OFFICE
CERTIFICATE OF CORRECTION

PATENT NO. : 7,308,067 B2  
APPLICATION NO. : 10/633872  
DATED : December 11, 2007  
INVENTOR(S) : Tyler A. Lowrey and Ward D. Parkinson Page 1 of 1

It is certified that error appears in the above-identified patent and that said Letters Patent is hereby corrected as shown below:

Column 6:  
Line 4, "tat" should be --that--.

Signed and Sealed this

Fifteenth Day of April, 2008

JON W. DUDAS  
*Director of the United States Patent and Trademark Office*